United States Patent
Park et al.

(10) Patent No.: US 10,247,992 B2
(45) Date of Patent: Apr. 2, 2019

(54) DISPLAY DEVICE

(71) Applicant: SAMSUNG DISPLAY CO., LTD., Yongin-si, Gyeonggi-do (KR)

(72) Inventors: Seunghyun Park, Seoul (KR); Junho Song, Seongnam-si (KR); Jeanho Song, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/040,699

(22) Filed: Feb. 10, 2016

(65) Prior Publication Data

US 2016/0349583 A1    Dec. 1, 2016

(30) Foreign Application Priority Data

May 28, 2015    (KR) .................. 10-2015-0075086

(51) Int. Cl.
*G02F 1/1339* (2006.01)
*H01L 27/32* (2006.01)
*G02F 1/1362* (2006.01)

(52) U.S. Cl.
CPC .. *G02F 1/136227* (2013.01); *G02F 1/136286* (2013.01); *G02F 1/13394* (2013.01); *H01L 27/3248* (2013.01); *H01L 27/3276* (2013.01)

(58) Field of Classification Search
CPC ............. H01L 27/3276; H01L 51/5237; H01L 27/3246; G02F 1/136227; G02F 1/1368; G02F 1/133514; G02F 1/133512; G02F 1/136286; G02F 1/13394; G02F 1/13624
See application file for complete search history.

(56) References Cited

U.S. PATENT DOCUMENTS

| 2004/0141142 A1* | 7/2004 | Choi ................... G02F 1/13394 349/155 |
| 2010/0073337 A1* | 3/2010 | Tsubata ............. G02F 1/133707 345/204 |
| 2010/0296015 A1 | 11/2010 | Kim et al. |
| 2010/0328564 A1 | 12/2010 | Jeong et al. |

(Continued)

FOREIGN PATENT DOCUMENTS

| KR | 1020020005997 | 1/2002 |
| KR | 1020090003608 | 1/2009 |

(Continued)

*Primary Examiner* — Michael H Caley
*Assistant Examiner* — Mariam Qureshi
(74) *Attorney, Agent, or Firm* — F. Chau & Associates, LLC (57) ABSTRACT

A display device includes a first substrate. A first gate line is disposed on the first substrate. First and second data lines intersect the first gate line. A first transistor is connected to the first gate line and the first data line. A second transistor is connected to the first gate line and the second data line. A first passivation layer is disposed on the first and second transistors, the first passivation layer including a first contact hole. A first pixel electrode is disposed on the first passivation layer, the first pixel electrode being connected to the first transistor through the first contact hole. A second pixel electrode is disposed on the first passivation layer, the second pixel electrode being connected to the second transistor through the first contact hole. The first and second transistors are both exposed through the first contact hole.

18 Claims, 6 Drawing Sheets

(56) References Cited

U.S. PATENT DOCUMENTS

| | | | | |
|---|---|---|---|---|
| 2011/0157039 A1* | 6/2011 | Shin | ............... | G02F 1/13338 |
| | | | | 345/173 |
| 2012/0182513 A1* | 7/2012 | Kim | ............... | G02F 1/1343 |
| | | | | 349/143 |
| 2012/0249943 A1* | 10/2012 | Pai | ............... | G09G 3/3614 |
| | | | | 349/141 |
| 2014/0098315 A1* | 4/2014 | Jung | ............... | G02F 1/136209 |
| | | | | 349/42 |
| 2014/0145195 A1* | 5/2014 | Kim | ............... | H01L 29/786 |
| | | | | 257/59 |
| 2015/0168772 A1* | 6/2015 | Jung | ............... | G02F 1/13394 |
| | | | | 349/106 |

FOREIGN PATENT DOCUMENTS

| | | |
|---|---|---|
| KR | 1020100124618 | 11/2010 |
| KR | 1020110001862 | 1/2011 |

* cited by examiner

DISPLAY DEVICE

CROSS-REFERENCE TO RELATED APPLICATION

This application claims priority under 35 U.S.C. § 119 to Korean Patent Application No. 10-2015-0075086, filed on May 28, 2015, in the Korean Intellectual Property Office (KIPO), the disclosure of which is incorporated by reference herein in its entirety.

TECHNICAL FIELD

Exemplary embodiments of the present invention relate to a display device, and more particularly, to a display device having a contact hole through which adjacent first and second transistors are both exposed.

DISCUSSION OF THE RELATED ART

Display devices are classified into types including liquid crystal display (LCD) devices, organic light emitting diode (OLED) display devices, plasma display panel (PDP) devices, electrophoretic display (EPD) devices, and the like, based on a light emitting scheme thereof.

In general, as a pixel area included in a display device increases, the resolution of the display device increases. In other words, a non-pixel area formed on a substrate can be small.

Accordingly, a size of a contact hole formed in the non-pixel area can be small. Use of an additional device for forming a minute contact hole during manufacturing, for example, a light exposure device having high-resolution, may be required. As a result, the manufacturing of such high-resolution display devices may lead to an increase in production costs.

SUMMARY

According to an exemplary embodiment of the present invention, a display device includes a first substrate. A first gate line is disposed on the first substrate. First and second data lines intersect the first gate line. A first transistor is connected to the first gate line and the first data line. A second transistor is connected to the first gate line and the second data line. A first passivation layer is disposed on the first and second transistors, the first passivation layer including a first contact hole. A first pixel electrode is disposed on the first passivation layer, the first pixel electrode being connected to the first transistor through the first contact hole. A second pixel electrode is disposed on the first passivation layer, the second pixel electrode being connected to the second transistor through the first contact hole. The first and second transistors are both exposed through the first contact hole.

In an exemplary embodiment of the present invention, the first pixel electrode and the second pixel electrode are spaced apart from one another and the first gate line is disposed between the first and second pixel electrodes.

In an exemplary embodiment of the present invention, the display device further includes a second gate line substantially parallel to the first gate line and a third data line substantially parallel to the first data line, wherein the second data line is disposed between the first data line and the third data line.

In an exemplary embodiment of the present invention, the display device further includes a third transistor connected to the second gate line and the second data line a fourth transistor connected to the second gate line and the third data line. A third pixel electrode is connected to the third transistor. A fourth pixel electrode is connected to the fourth transistor. The third and fourth pixel electrodes are connected to the third and fourth transistors through a second contact hole formed in the first passivation layer.

In an exemplary embodiment of the present invention, the third and fourth transistors are both exposed through the second contact hole.

In an exemplary embodiment of the present invention, the third pixel electrode is spaced apart from the fourth pixel electrode and the second gate line is disposed between the third and fourth pixel electrodes.

In an exemplary embodiment of the present invention, the first transistor and the second transistor are disposed on the first substrate on a same side of the first gate line. The third transistor and the fourth transistor are disposed on the first substrate on a same side of the second gate line.

In an exemplary embodiment of the present invention, the first passivation layer includes a plurality of layers.

In an exemplary embodiment of the present invention, the first passivation layer includes an inorganic layer and an organic layer disposed on the inorganic layer.

In an exemplary embodiment of the present invention, the organic layer includes a photosensitive resin composition.

In an exemplary embodiment of the present invention, the display device further includes a common electrode disposed on the first passivation layer, the common electrode overlapping the first, second, third and fourth pixel electrodes. A second passivation layer is disposed on the common electrode.

In an exemplary embodiment of the present invention, the second passivation layer includes a first aperture connected to the first contact hole and a second aperture connected to the second contact hole.

In an exemplary embodiment of the present invention, the display device further includes a second substrate opposing the first substrate. A liquid crystal layer is disposed between the first substrate and the second substrate. A light shielding layer and a color filter layer are disposed on the first substrate or the second substrate. A first column spacer is disposed between the first substrate and the second substrate.

In an exemplary embodiment of the present invention, the first column spacer protrudes from the light shielding layer.

In an exemplary embodiment of the present invention, the display device further includes an additional first contact hole formed in the first passivation layer, wherein the first contact hole and the additional first contact hole are formed on a same side of the first gate line. The first column spacer is disposed between the first contact hole and the additional first contact hole.

In an exemplary embodiment of the present invention, the display device further includes an additional second contact hole formed in the first passivation layer, wherein the second contact hole and the additional second contact hole are formed on a same side of the second gate line. A second column spacer is disposed between the second contact hole and the additional second contact hole.

In an exemplary embodiment of the present invention, the first pixel electrode and the second pixel electrode receive voltages having opposite polarities, respectively.

In an exemplary embodiment of the present invention, the third pixel electrode and the fourth pixel electrode receive voltages having opposite polarities, respectively.

In an exemplary embodiment of the present invention, the first pixel electrode and the fourth pixel electrode receive voltages having a same polarity.

According to an exemplary embodiment of the present invention, a display device includes a substrate. A first gate line is disposed on the substrate and extending in a first direction. A first data line and a second data line are disposed on the substrate, wherein each of the first and second data lines extend in a second direction that crosses the first direction. A first transistor is connected to the first gate line and the first data line. A second transistor is disposed adjacent to the first transistor and is connected to the first gate line and the second data line. A first passivation layer is disposed on the first and second transistors, wherein the first passivation layer includes a first contact hole that exposes a portion of the first transistor and a portion of the second transistor. A first pixel electrode and a second pixel electrode are disposed on the first passivation layer, wherein the first gate line is disposed between the first and second pixel electrodes. The first pixel electrode is connected to the first transistor through the first contact hole and the second pixel electrode is connected to the second transistor through the first contact hole. The first and second pixel electrodes are disposed between the first data line and the second data line.

BRIEF DESCRIPTION OF THE DRAWINGS

The above and other features and aspects of the present invention will become more clearly understood by describing in detail exemplary embodiments thereof with reference to the accompanying drawings, in which.

DETAILED DESCRIPTION OF THE EMBODIMENTS

Exemplary embodiments of the present invention will now be described more fully hereinafter with reference to the accompanying drawings. The present invention may, however, be embodied in many different forms and should not be construed as being limited to the exemplary embodiments set forth herein. Rather, these exemplary embodiments are provided so that this disclosure will be thorough and complete, and may convey the scope of the invention to those skilled in the art.

In the drawings, the dimensions of certain elements or shapes may be simplified or exaggerated to better illustrate the present invention. Thus, the drawings are intended to facilitate the understanding of the present invention. Like reference numerals may refer to like elements throughout the specification.

Throughout the specification, when an element is referred to as being "connected" to another element, the element may be directly connected to the other element or intervening elements may be disposed therebetween. In addition, when an element is referred to as being "electrically connected" to the other element, the element may be directly electrically connected to the other element or one or more intervening elements may be electrically connected therebetween.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

When a layer or element is referred to as being "on" another layer or element, the layer or element may be disposed directly on the other layer or element, or one or more intervening layers or elements may be disposed therebetween.

Figure 1:
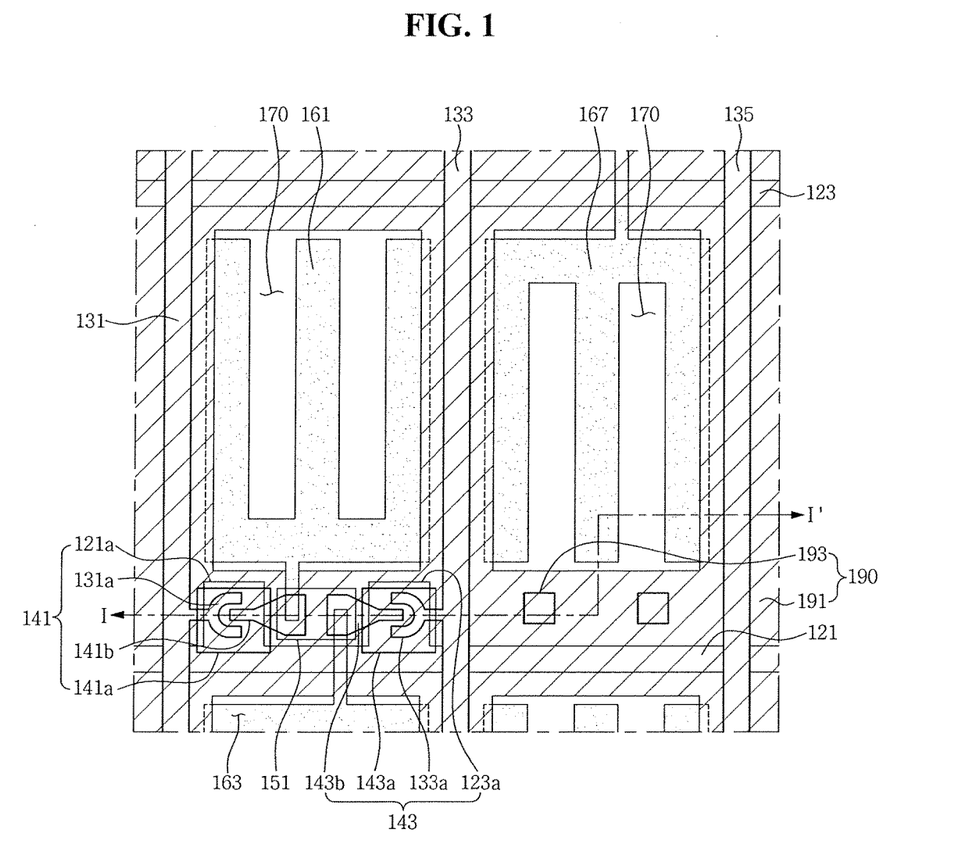
FIG. 1 is a plan view illustrating a display device according to an exemplary embodiment of the present invention.
Figure 2:
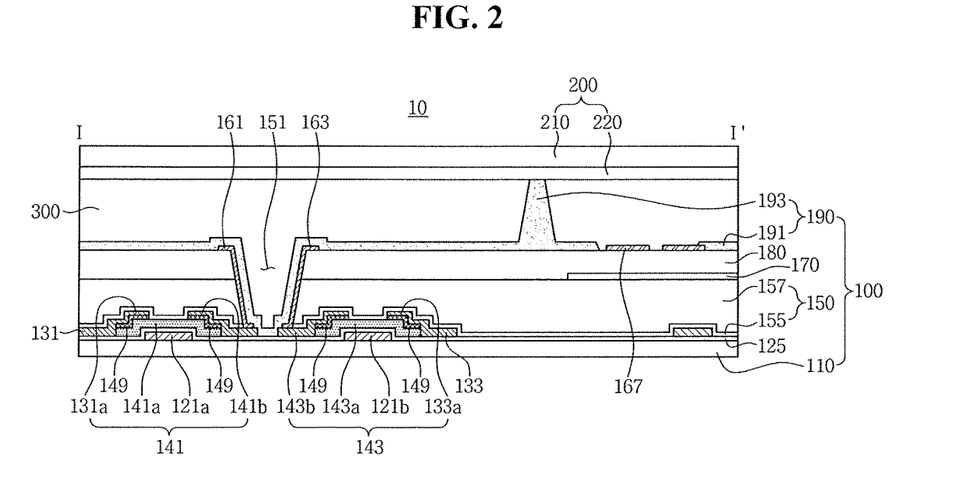
FIG. 2 is a cross-sectional view taken along line I-I' of FIG. 1, according to an exemplary embodiment of the present invention.
Figure 3:
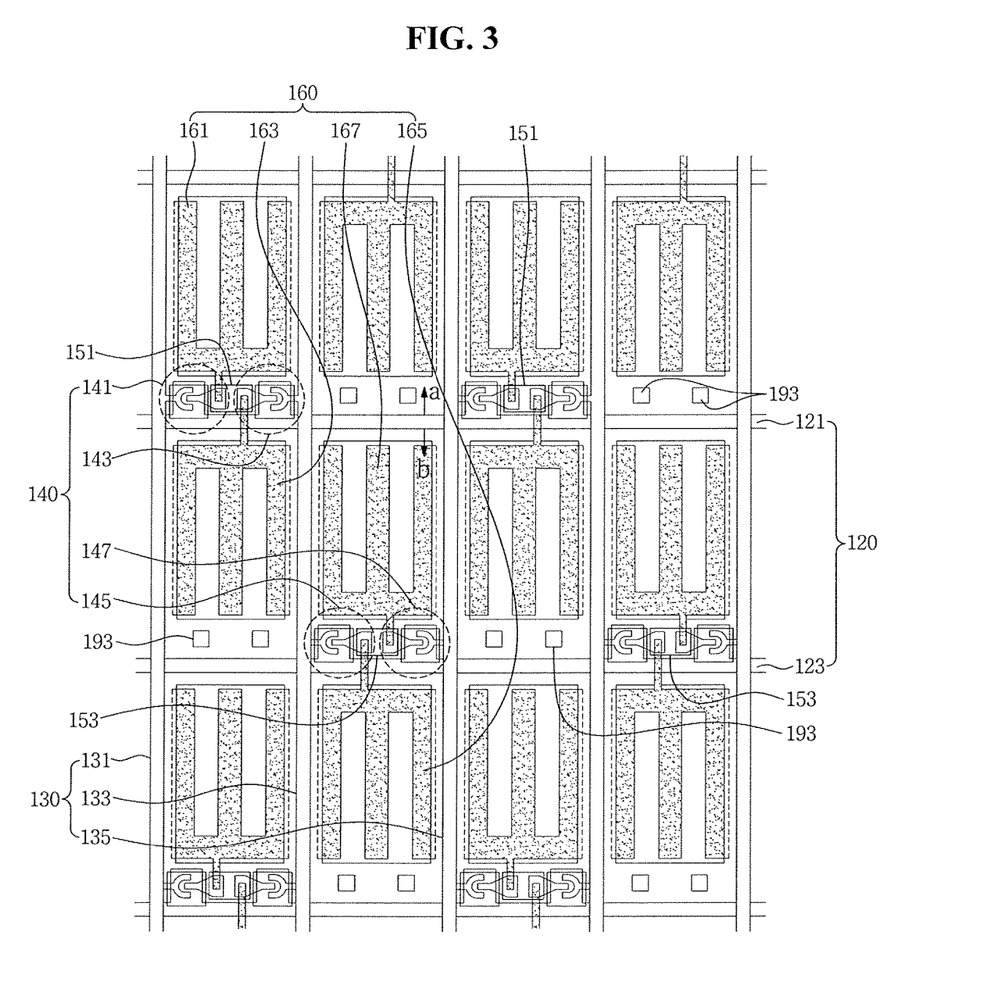
FIG. 3 is a schematic plan view illustrating the display device of FIG. 1, according to an exemplary embodiment of the present invention.
Figure 4A:
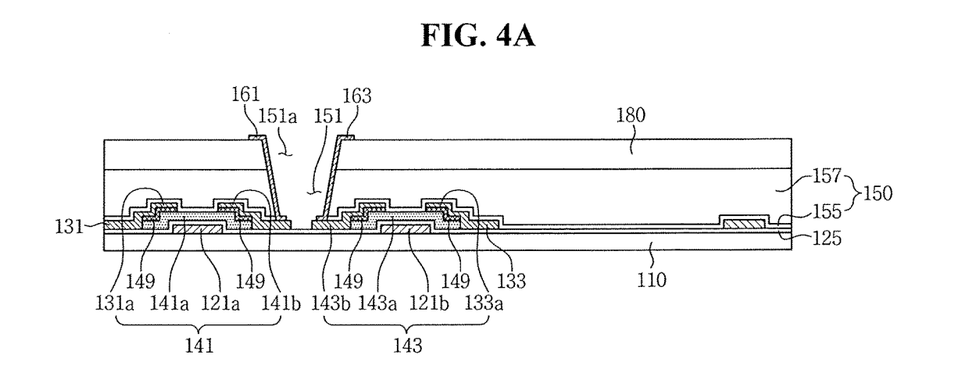
FIG. 4A is a cross-sectional view illustrating a first contact hole according to an exemplary embodiment of the present invention.
Figure 4B:
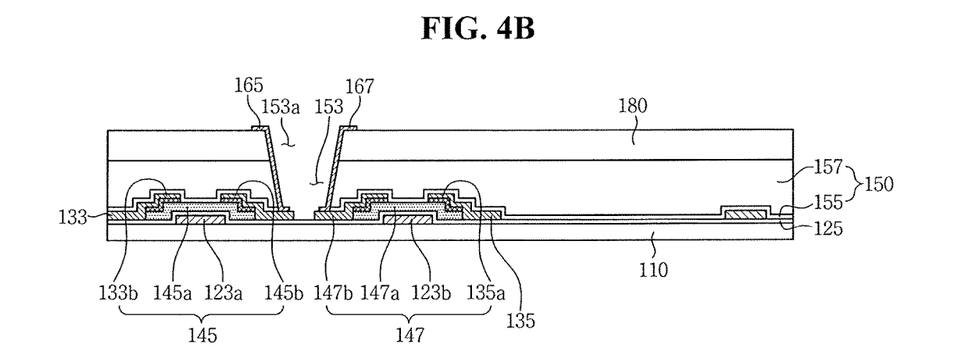
FIG. 4B is a cross-sectional view illustrating a second contact hole according to an exemplary embodiment of the present invention.

Hereinafter, exemplary embodiments of the present invention will be described with reference to the accompanying drawings. FIG. 1 is a plan view illustrating a display device 10 according to an exemplary embodiment of the present invention. FIG. 2 is a cross-sectional view taken along line I-I' of FIG. 1, according to an exemplary embodiment of the present invention. FIG. 3 is a schematic plan view illustrating the display device 10 of FIG. 1, according to an exemplary embodiment of the present invention. FIG. 4A is a cross-sectional view illustrating a first contact hole 151, according to an exemplary embodiment of the present invention. FIG. 4B is a cross-sectional view illustrating a second contact hole 153, according to an exemplary embodiment of the present invention.

Referring to FIGS. 1, 2 and 3, the display device 10 includes a lower panel 100, an upper panel 200 opposing the lower panel 100, and a liquid crystal layer 300 disposed between the lower panel 100 and the upper panel 200.

The lower panel 100 includes a first substrate 110, gate lines 120 disposed on the first substrate 110, data lines 130, transistors 140, a first passivation layer 150 disposed on the data lines 130 and on the transistors 140, and pixel electrodes 160 disposed on the first passivation layer 150.

The first substrate 110 is an insulating substrate formed of, for example, plastic, transparent glass such as soda lime glass or borosilicate glass, or the like. For example, the first substrate 110 may be transparent.

The plurality of gate lines 120 transmit gate signals and are disposed on the first substrate 110. The gate lines 120 may be formed to extend in a first direction. The gates line 120 may be connected to the transistors 140.

The gate lines 120 may include, for example, an aluminum (Al) based metal such as Al or an Al alloy, a silver (Ag) based metal such as Ag or an Ag alloy, a copper (Cu) based metal such as Cu or an Cu alloy, a molybdenum (Mo) based metal such as Mo or a Mo alloy, chromium (Cr), titanium (Ti), tantalum (Ta), or the like.

The gate lines 120 may have a multilayer structure including two conductive layers having different physical properties.

For example, one of the two conductive layers may include a metal, for example, an Al-based metal, an Ag-based metal or a Cu-based metal, which has relatively low resistivity to reduce a signal delay or a voltage drop of the gate lines 120.

The other of the two conductive layers may include a material, for example, a Mo-based metal, Cr, Ti or Ta, which has a good contact property with a transparent conductive oxide (TCO) such as indium-tin oxide (ITO), indium-zinc oxide (IZO) or aluminum-zinc oxide (AZO).

The data lines 130 are formed to extend in a second direction which crosses the first direction. The data lines 130 are connected to the transistors 140. With reference to FIGS. 1 to 4B, the data lines 130 are connected to the transistors 140 through data electrodes 131a, 133a, 133b and 135a. The data lines 130 transmit data signal voltages to the pixel electrodes 160 through the transistors 140.

A gate insulating layer 125 is disposed between the gate lines 120 and the data lines 130. In an exemplary embodiment of the present invention, the gate insulating layer 125 is formed over an entire surface of the first substrate 110 to cover and insulate the gate lines 120. The gate insulating layer 125 may include, for example, silicon nitride ($SiN_x$), silicon oxide ($SiO_x$), or the like. The gate insulating layer 125 may have a multilayer structure including at least two insulating layers having different physical properties.

The gate insulating layer 125 serves to prevent a short-circuit between adjacent gate lines 120. In addition, the gate insulating layer 125 serves to insulate the gate lines 120 from other conductive elements disposed on the gate lines 120.

The transistors 140 are disposed on the gate insulating layer 125. The transistors 140 include a semiconductor layer disposed on the gate insulating layer 125. The transistors 140 are connected to the gate lines 120, the data lines 130, and the pixel electrodes 160.

Referring to FIG. 3, the gate lines 120, according to an exemplary embodiment of the present invention, include first and second gate lines 121 and 123. The first gate line 121 may be one of the gate lines from among the plurality of gate lines 120. The second gate line 123 may be another gate line from among the plurality of gate lines 120 that is spaced apart from the first gate line 121. In other words, the second gate line 123 may be disposed in one of an "a" direction and a "b" direction with respect to the first gate line 121, as indicated by the arrows in FIG. 3.

The data lines 130, according to an exemplary embodiment of the present invention, include first, second and third data lines 131, 133 and 135. The first data line 131 may be one of the data lines from among the plurality of data lines 130. The second data line 133 may be another data line from among the plurality of data lines 130 that is spaced apart from the first data line 131. In addition, the third data line 135 may be disposed to be substantially parallel to the first data line 131. The second data line 133 is disposed between the first data line 131 and third data line 135.

The gate lines 120 and the data lines 130 intersect one another. Accordingly, the first gate line 121 and the second gate line 123 each intersect the first, second and third data lines 131, 133 and 135.

The transistors 140 includes first, second, third and fourth transistors 141, 143, 145 and 147. The first transistor 141 is connected to the first gate line 121 and the first data line 131. The second transistor 143 is connected to the first gate line 121 and the second data line 133.

Referring to FIGS. 2 and 3, the first transistor 141 connected to the first data line 131 through a first data electrode 131a, and is connected to the first gate line 121 through a first gate electrode 121a. In addition, the second transistor 143 is connected to the second data line 133 through a second data electrode 133a, and may be connected to the first gate line 121 through a first gate electrode 121b.

The third transistor 145 is connected to the second gate line 123 and the second data line 133. The fourth transistor 147 is connected to the second gate line 123 and the third data line 135.

Referring to FIGS. 3 and 4B, the third transistor 145 is connected to the second data line 133 through a second data electrode 133b, and is connected to the second gate line 123 through a second gate electrode 123a. In addition, the fourth transistor 147 is connected to the third data line 135 through a third data electrode 135a, and is connected to the second gate line 123 through a second gate electrode 123b.

The first transistor 141 and the second transistor 143 are disposed on the first substrate 110 on the same side of the first gate line 121. In other words, the first transistor 141 and the second transistor 143 are disposed in one of the "a" direction and the "b" direction with respect to the first gate line 121. For example, the first and third transistors 141 and 143 are disposed in the "a" direction. The first transistor 141 and the second transistor 143 are both exposed through a first contact hole 151.

Similarly, the third transistor 145 and the fourth transistor 147 are disposed on the first substrate 110 on the same side of the second gate line 123. The third transistor 145 and the fourth transistor 147 are both exposed through a second contact hole 153.

Each of the first to fourth transistors 141, 143, 145 and 147 of the transistors 140 includes a source electrode, a semiconductor layer, a drain electrode, and a gate electrode. The source electrodes of the transistors 140 connect the transistors 140 and the data lines 130. In addition, the drain electrodes of the transistors 140 connect the transistors 140 and the pixel electrodes 160. The gate electrodes of each of the first to fourth transistors 141, 143, 145 and 147 of the transistors 140 may be formed to protrude from the gate lines 120. Further, the gate electrodes of each of the first to fourth transistors 141, 143, 145 and 147 of the transistors 140 may be disposed below the respective semiconductor layers and may overlap the semiconductor layers.

In an exemplary embodiment of the present invention, the source electrodes may include the first data electrode 131a, the second data electrodes 133a and 133b, and the third data electrode 135a, which protrude from the data lines 130. First, second, third and fourth semiconductor layers 141a, 143a, 145a and 147a form channels through which currents flow. First, second, third and fourth drain electrodes 141b, 143b, 145b and 147b may be connected to the pixel electrodes 160 through the first and second contact holes 151 and 153.

An ohmic contact layer 149 may be disposed on the first, second, third and fourth semiconductor layers 141a, 143a, 145a and 147a. The ohmic contact layer 149 serves to increase a contact between the first, second and third data electrodes 131a, 133a, 133b and 135a and the first, second, third and fourth semiconductor layers 141a, 143a, 145a and 147a. In addition, the ohmic contact layer 149 serves to increase a contact between the first, second, third and fourth drain electrodes 141b, 143b, 145b and 147b and the first, second, third and fourth semiconductor layers 141a, 143a, 145a and 147a.

The ohmic contact layer 149 may be formed of amorphous silicon doped with high-concentration n-type impurities (e.g., n+a-Si). In a case in which a contact between the data electrodes 131a, 133a, 133b and 135a and/or the drain electrodes 141b, 143b, 145b and 147b, and a contact between and the first, second, third and fourth semiconductor layers 141a, 143a, 145a and 147a is secured, the ohmic contact layer 149 may be omitted.

The first passivation layer 150 is disposed on the transistors 140, the data lines 130, and the gate insulating layer 125. The first passivation layer 150 covers the transistors 140, the data lines 130, and the gate insulating layer 125 to prevent movement thereof and to achieve an insulation thereof from other conductive elements disposed on the first passivation layer 150.

The first passivation layer 150 may have a single layer structure or a multilayer structure including a plurality of layers. In an exemplary embodiment of the present invention, as illustrated in FIGS. 2, 4A, and 4B, the first passivation layer 150 may include an inorganic layer 155 and an organic layer 157.

The inorganic layer 155 covers and protects the transistors 140, the data lines 130, and the gate insulating layer 125. The organic layer 157 is disposed on the inorganic layer 155. The organic layer 157 allows one of the transistors 140 and the data lines 130 to be spaced apart from one of the pixel electrodes 160 and a common electrode 170. Such a structure of the organic layer 157 may decrease the generation of parasitic capacitance that may occur between one of the transistors 140 and the data lines 130 and one of the pixel electrodes 160 and the common electrode 170.

The inorganic layer 155 may include, for example, silicon oxide ($SiO_x$), silicon nitride ($SiN_x$), or a low-dielectric-constant insulating material such as a-Si:C:O or a-Si:O:F. In addition, the organic layer 157 may include a photosensitive resin composition.

The first passivation layer 150 has the first contact hole 151 and the second contact hole 153. The first and second contact holes 151 and 153 vertically penetrate through the first passivation layer 150.

The first transistor 141 and the second transistor 143 are both exposed through the first contact hole 151. For example, at least a portion of the first drain electrode 141b and at least a portion of the second drain electrode 143b are both exposed through the first contact hole 151.

In addition, the third transistor 145 and the fourth transistor 147 are both exposed through the second contact hole 153. For example, at least a portion of the third drain electrode 145b and at least a portion of the fourth drain electrode 147b are both exposed through the second contact hole 153.

Referring to FIG. 3, the pixel electrodes 160 include a plurality of pixel electrodes disposed on the first passivation layer 150. In an exemplary embodiment of the present invention, the pixel electrodes 160 include first, second, third and fourth pixel electrodes 161, 163, 165 and 167.

The first pixel electrode 161 and the second pixel electrode 163 are disposed to be spaced apart from one another while having the first gate line 121 disposed therebetween. The third pixel electrode 165 and the fourth pixel electrode 167 are disposed to be spaced apart from one another while having the second gate line 123 disposed therebetween.

In addition, the first pixel electrode 161 and the second pixel electrode 163 are disposed between the first data line 131 and the second data line 133. The third pixel electrode 165 and the fourth pixel electrode 167 are disposed between the second data line 133 and the third data line 135.

Referring to FIGS. 4A and 4B, the first pixel electrode 161 is connected to the first transistor 141 through the first contact hole 151, and the second pixel electrode 163 is connected to the second transistor 143 through the first contact hole 151. In addition, the third pixel electrode 165 is connected to the third transistor 145 through the second contact hole 153, and the fourth pixel electrode 167 is connected to the fourth transistor 147 through the second contact hole 153.

The first pixel electrode 161 and the second pixel electrode 163 extend onto the first contact hole 151 without contacting one another. In addition, the third pixel electrode 165 and the fourth pixel electrode 167 extend onto the second contact hole 153 without contacting one another.

The lower panel 100, according to an exemplary embodiment of the present invention, may include the common electrode 170, a second passivation layer 180 disposed on the common electrode 170, and a light shielding unit 190 disposed on the second passivation layer 180.

The common electrode 170 and the second passivation layer 180 are disposed between the first passivation layer 150 and the pixel electrodes 160. The common electrode 170 is disposed on the first passivation layer 150 while overlapping the first, second, third and fourth pixel electrodes 161, 163, 165 and 167.

In an exemplary embodiment of the present invention, the common electrode 170, which is a planar electrode, may include a TCO such as ITO, IZO or AZO.

The second passivation layer 180 is disposed on the common electrode 170 and the first passivation layer 150. The second passivation layer 180 spatially separates the common electrode 170 and the pixel electrodes 160 from one another. In other words, the second passivation layer 180 insulates the common electrode 170 from the pixel electrodes 160. An electric field is formed between the common electrode 170 and the pixel electrodes 160, and the liquid crystal layer 300 is controlled by the electric field.

Referring to FIGS. 4A and 4B, the second passivation layer 180 has apertures respectively connected to the first and second contact holes 151 and 153. A first aperture 151a formed in the second passivation layer 180 is connected to the first contact hole 151 formed in the first passivation layer 150. In addition, a second aperture 153a formed in the second passivation layer 180 is connected to the second contact hole 153 formed in the first passivation layer 150.

The second passivation layer 180 may have a single layer or a multilayer structure including a photosensitive organic material, silicon oxide ($SiO_x$), silicon nitride ($SiN_x$), a low-dielectric-constant insulating material such as a-Si:C:O or a-Si:O:F, or the like. In a case in which the second passivation layer 180 is formed of a photosensitive organic material, the second passivation layer 180 may be referred to as an organic layer.

The light shielding unit 190 is disposed on one of the first and second passivation layers 150 and 180. In addition, the light shielding unit 190 may be disposed on a second substrate 210 of the upper panel 200 as shown in FIG. 2. The light shielding unit 190 prevents light supplied from a backlight unit from being transmitted externally, and prevents externally incident light on the display device 10 from being irradiated to the gate lines 120, the data lines 130, or the transistors 140.

Referring to FIG. 2, the light shielding unit 190 includes a light shielding layer 191 and a column spacer 193. The column spacer 193 may be disposed on the light shielding layer 191.

The light shielding layer 191 may also be referred to as a black matrix. The light shielding layer 191 divides a plurality of color filters 220 of the upper panel 200 to define pixel areas, and prevents light leakage. The light shielding layer 191 may have a lattice structure in which the components of the lattice structure of the light shielding layer 191 are disposed along the gate lines 120 and the data lines 130. In addition, the light shielding layer 191 may overlap the gate lines 120, the data lines 130, and the transistors 140.

The column spacer 193 may have a structure protruding from the light shielding layer 191. In this case, the column spacer 193 may be integrally formed with the light shielding layer 191. At least one column spacer 193 may be disposed in an area in which the first, second, third and fourth transistors 141, 143, 145 and 147 are absent (e.g., the column spacer 193 may be disposed in an area in which the transistors 140 are not disposed).

Referring to FIG. 3, the column spacer 193 may be disposed between the first contact holes 151 formed along the first gate line 121. In addition, the column spacer 193 may be disposed between the second contact holes 153 formed along the second gate line 123.

According to an exemplary embodiment of the present invention, the light shielding unit 190 may be disposed on the second substrate 210.

Figure 6:
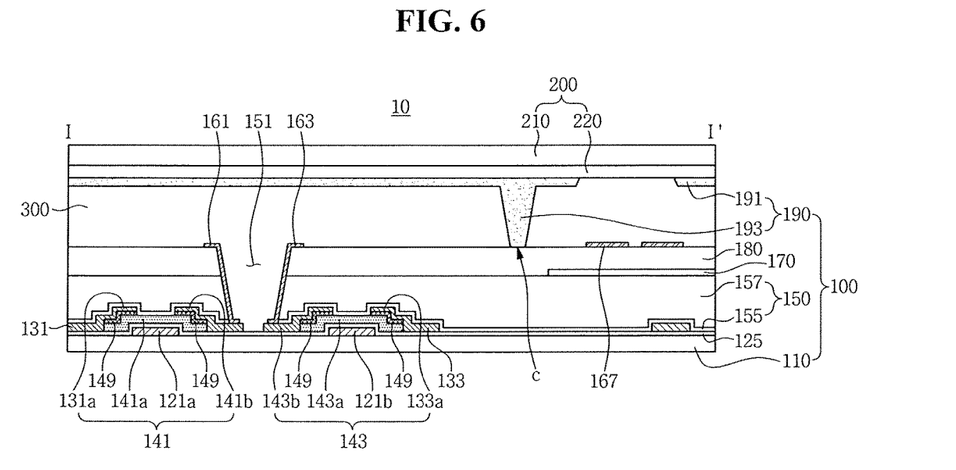
FIG. 6 is a cross-sectional view illustrating a display device according to an exemplary embodiment of the present invention.

FIG. 6 is a cross-sectional view illustrating a display device 10 according to an exemplary embodiment of the present invention.

Referring to FIG. 6, a light shielding unit 190 may be disposed on an upper panel 200 including a second substrate 210. In this case, a column spacer 193 which protrudes from a light shielding layer 191 contacts a lower panel 100. The column spacer 193 contacts an area "c" in which first, second, third and fourth transistors 141, 143, 145 and 147 are absent. The column spacer 193 is supported on the area "c".

Even in a case in which the light shielding unit 190 is disposed on the second substrate 210, the column spacer 193 may be disposed between first contact holes 151 formed along a first gate line 121. In addition, the column spacer 193 may be disposed between second contact holes 153 formed along a second gate line 123.

When a plurality of column spacers 193 are disposed as described above, external pressure applied to the display device 10 may be supported by the column spacers 193 to maintain a substantially uniform distance between the lower panel 100 and the upper panel 200. Accordingly, the overall operational efficiency of the display device 10 may be increased.

The distance between the lower panel 100 and the upper panel 200 of the display device 10 may be referred to as a cell gap. The cell gap affects the overall operational efficiency of the display device 10, such as, for example, response speed, a contrast ratio, a viewing angle, and luminance uniformity. Accordingly, with a non-uniform cell gap, an image may not be uniformly displayed throughout an entire screen, thus leading to an image quality defect. Thus, the plurality of column spacers 193 may be disposed on at least one of the lower panel 100 and the upper panel 200 in order to maintain a substantially uniform cell gap throughout an entire area of the panel.

The upper panel 200 is disposed to face the lower panel 100. In addition, the upper panel 200 may include the second substrate 210 and a color filter layer 220.

The second substrate 210 is disposed to oppose a first substrate 110. The second substrate 210 is an insulating substrate formed, for example, of plastic, transparent glass such as soda lime glass or borosilicate glass, or the like. For example, the first substrate 110 may be transparent.

The color filter layer 220 may be formed on an entire surface of the second substrate 210. In addition, the color filter layer 220 may include a red color filter, a green color filter, and a blue color filter. Each of the red, green, and blue color filters is disposed to correspond to a pixel area. Accordingly, the red color filter forms a red pixel area, the green color filter forms a green pixel area, and the blue color filter forms a blue pixel area.

While according to an exemplary embodiment of the present invention the color filter layer 220 is disposed on the second substrate 210, the present invention is not limited thereto. For example, according to an exemplary embodiment of the present invention, the color filter layer 220 may be disposed on the first substrate 110.

In the foregoing, configurations of the display device 10 have been described in accordance with exemplary embodiments of the present invention. Hereinafter, driving the display device 10 will be described according to an exemplary embodiment of the present invention.

Figure 5:
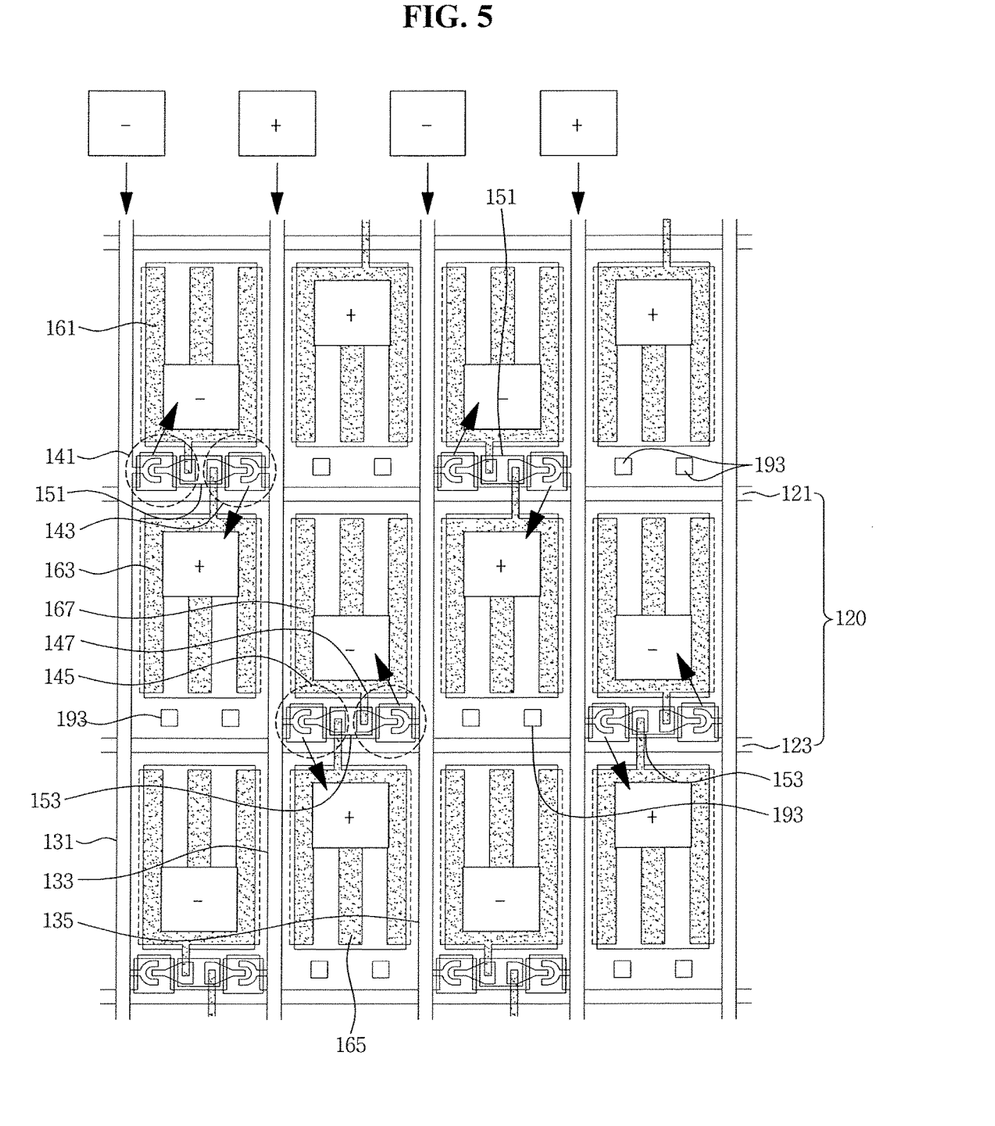
FIG. 5 is a plan view illustrating a driving scheme of the display device of FIG. 3, according to an exemplary embodiment of the present invention.

FIG. 5 is a plan view illustrating a driving scheme of the display device 10 of FIG. 3, according to an exemplary embodiment of the present invention.

Referring to FIG. 5, a data signal voltage having a negative polarity is applied to the first data line 131 and the third data line 135. In addition, a data signal voltage having a positive polarity is applied to the second data line 133. The data signal voltages applied to the respective data lines 130 are transmitted to the pixel electrodes 160 according to gate driving signal voltages applied to the gate lines 120.

A data signal voltage having a negative polarity may be applied to the first pixel electrode 161 through the first transistor 141 connected to the first data line 131. In addition, a data signal voltage having a negative polarity may be applied to the fourth pixel electrode 167 through the fourth transistor 147 connected to the third data line 135.

A data signal voltage having a positive polarity may be applied to the third pixel electrode 165 through the third transistor 145 connected to the second data line 133. A data signal voltage having a positive polarity may be applied to the second pixel electrode 163 through the second transistor 143 connected to the second data line 133.

In other words, the first pixel electrode 161 and the fourth pixel electrode 167 are applied with a data signal voltage having a negative polarity, and the second pixel electrode 163 and the third pixel electrode 165 are applied with a data signal voltage having a positive polarity.

As described above, the first pixel electrode 161 and the second pixel electrode 163 are spaced apart from one another while having the first gate line 121 disposed therebetween. The third pixel electrode 165 and the fourth pixel electrode 167 are spaced apart from one another while having the second gate line 123 disposed therebetween. In addition, the plurality of pixel electrodes 160 are disposed along the gate line 120.

Accordingly, in an exemplary embodiment of the present invention, one pixel electrode of the plurality of pixel electrodes 160 has a data signal voltage having an opposite polarity than that of each neighboring pixel electrode of the plurality of pixel electrodes 160 disposed above and below (e.g., along the direction in which the data lines 130 extend) it. In addition, in an exemplary embodiment of the present invention, the one pixel electrode of the plurality of pixel electrodes 160 has a data signal voltage having an opposite polarity than that of each neighboring pixel electrode of the plurality of pixel electrodes 160 disposed left and right (e.g., along the direction in which the gate lines 120 extend) of it. In this manner, the display device 10 may be driven in a dot-inversion scheme with decreased power consumption.

Thus, a flicker phenomenon, which is a flashing effect occurring in the display device 10, may be reduced.

As described above, according to one or more exemplary embodiments of the present invention, the adjacent first and second transistors 141 and 143 are both exposed through the contact hole 151 formed in the first passivation layer 150. Thus, even in the case of the display device 10 having a high resolution, a large contact hole may be formed therein. Accordingly, an additional device for forming a minute contact hole may be unnecessary. Thus, production costs may be reduced.

In addition, the first pixel electrode 161 and the second pixel electrode 163 are spaced apart from one another while having the first gate line 121 disposed therebetween, and the third pixel electrode 165 and the fourth pixel electrode 167 are spaced apart from one another while having the second gate line 123 disposed therebetween. Further, the first pixel electrode 161 and the second pixel electrode 163 are disposed between the first data line 131 and the second data line 133, and the third pixel electrode 165 and the fourth pixel electrode 167 are disposed between the second data line 133 and the third data line 135.

In this case, a data signal voltage having a negative polarity is applied to the first data line 131 and to the third data line 135, and a data signal voltage having a positive polarity is applied to the second data line 133.

Accordingly, one of the first, second, third and fourth pixel electrodes 161, 163, 165 and 167 has a data signal voltage having a polarity opposite to a polarity of a data signal voltage of another adjacent pixel electrode. Thus, the display device may be driven in a dot-inversion scheme with reduced power consumption.

According to an exemplary embodiment of the present invention, a high resolution display device includes a large contact hole exposing two adjacent transistors. While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display device comprising:
a first substrate;
a first gate line disposed on the first substrate and extending in a first direction;
a second gate line disposed on the first substrate and extending in the first direction, wherein the second gate line is spaced apart from the first gate line in a second direction crossing the first direction;
first, second and third data lines extending in the second direction and intersecting the first and second gate lines, wherein the second data line is disposed between the first and third data lines;
a first transistor connected to the first gate line and the first data line;
a second transistor connected to the first gate line and the second data line;
a third transistor connected to the second gate line and the second data line;
a fourth transistor connected to the second gate line and the third data line;
a first passivation layer disposed on the first, second, third and fourth transistors, the first passivation layer including a first contact hole and a second contact hole;
a first pixel electrode disposed on the first passivation layer, the first pixel electrode being connected to the first transistor through the first contact hole;
a second pixel electrode disposed on the first passivation layer, the second pixel electrode being connected to the second transistor through the first contact hole;
a third pixel electrode disposed on the first passivation layer, the third pixel electrode being connected to the third transistor through the second contact hole; and
a fourth pixel electrode disposed on the first passivation layer, the fourth pixel electrode being connected to the fourth transistor through the second contact hole,
wherein the first and second transistors are both exposed through the first contact hole, wherein the second and third pixel electrodes are arranged along the first direction such that the second and third pixel electrodes are adjacent to each other in the first direction.

2. The display device of claim 1, wherein the first pixel electrode and the second pixel electrode are spaced apart from one another and the first gate line is disposed between the first and second pixel electrodes.

3. The display device of claim 1, wherein the third and fourth transistors are both exposed through the second contact hole.

4. The display device of claim 3, wherein the third pixel electrode is spaced apart from the fourth pixel electrode and the second gate line is disposed between the third and fourth pixel electrodes.

5. The display device of claim 4, wherein the first transistor and the second transistor are disposed on the first substrate on a same side of the first gate line, and
the third transistor and the fourth transistor are disposed on the first substrate on a same side of the second gate line.

6. The display device of claim 5, wherein the first passivation layer comprises a plurality of layers.

7. The display device of claim 6, wherein the first passivation layer comprises an inorganic layer and an organic layer disposed on the inorganic layer.

8. The display device of claim 7, wherein the organic layer comprises a photosensitive resin composition.

9. The display device of claim 8, further comprising:
a common electrode disposed on the first passivation layer, the common electrode overlapping the first, second, third and fourth pixel electrodes; and
a second passivation layer disposed on the common electrode.

10. The display device of claim 9, wherein the second passivation layer includes a first aperture connected to the first contact hole and a second aperture connected to the second contact hole.

11. The display device of claim 10, further comprising:
a second substrate opposing the first substrate;
a liquid crystal layer disposed between the first substrate and the second substrate;
a light shielding layer and a color filter layer disposed on the first substrate or the second substrate; and
a first column spacer disposed between the first substrate and the second substrate.

12. The display device of claim 11, wherein the first column spacer protrudes from the light shielding layer.

13. The display device of claim 11, further comprising:
an additional first contact hole formed in the first passivation layer, wherein the first contact hole and the additional first contact hole are formed on a same side of the first gate line, wherein the first column spacer is disposed between the first contact hole and the additional first contact hole.

14. The display device of claim 13, further comprising:
an additional second contact hole formed in the first passivation layer, wherein the second contact hole and the additional second contact hole art formed on a same side of the second gate line,
wherein a second column spacer is disposed between the second contact hole and the additional second contact hole.

15. The display device of claim 14, wherein the first pixel electrode and the second pixel electrode receive voltages having opposite polarities, respectively.

16. The display device of claim 15, wherein the third pixel electrode and the fourth pixel electrode receive voltages having opposite polarities, respectively.

17. The display device of claim 16, wherein the first pixel electrode and the fourth pixel electrode receive voltages having a same polarity.

18. A display device comprising:
a substrate;
first, second and third gate lines extending on the substrate in a first direction and consecutively arranged in a second direction crossing the first direction such that the second gate line is disposed between the first and third gate lines;
first, second, third and fourth data lines extending on the substrate in the second direction, wherein the first, second, third and fourth data lines are consecutively arranged in the first direction;
a first pixel electrode disposed on the substrate between the first and second gate lines and between the first and second data lines, a second pixel electrode disposed on the substrate between the first and second gate lines and between the second and third data lines, a third pixel electrode disposed on the substrate between the first and second gate lines and between the third and fourth data lines, a fourth pixel electrode disposed on the substrate between the second and third gate lines and between the first and second data lines, a fifth pixel electrode disposed on the substrate between the second and third gate lines and between the second and third data lines, and a sixth pixel electrode disposed on the substrate between the second and third gate lines and between the third and fourth data lines;
a first transistor connected to the first pixel electrode, the second gate line and the first data line, a second transistor connected to the fourth pixel electrode, the second gate line and the second data line, wherein both the first and second transistors are disposed on the substrate between the first and second data lines,
a third transistor connected to the third pixel electrode, the second gate line and the third data line, a fourth transistor connected to the sixth pixel electrode, the second gate line and the fourth data line, wherein both the third and fourth transistors are disposed on the substrate between the third and fourth data lines,
a fifth transistor connected to the second pixel electrode and the first gate line, and a sixth transistor connected to the fifth pixel electrode and the third gate line; and
a first passivation layer disposed on the first and second transistors, wherein the first passivation layer includes a first contact hole and a second contact hole, wherein the first contact hole exposes a portion of the first transistor and a portion of the second transistor, and the second contact hole exposes a portion of the third transistor and a portion of the fourth transistor,
wherein the first transistor is connected to the first pixel electrode through the first contact hole and the second transistor is connected to the fourth pixel electrode through the first contact hole, and
wherein the third transistor is connected to the third pixel electrode through the second contact hole and the fourth transistor is connected to the sixth pixel electrode through the second contact hole,
wherein the first, second and third pixel electrodes are arranged along first direction such that the first, second and third pixel electrodes are adjacent to one another in the first direction,
wherein the fourth, fifth and sixth pixel electrodes are arranged along the first direction such that the fourth, fifth and sixth pixel electrodes are adjacent to one another in the first direction.

* * * * *